United States Patent
Kabe et al.

(10) Patent No.: US 8,536,704 B2
(45) Date of Patent: Sep. 17, 2013

(54) SEMICONDUCTOR DEVICE AND METHOD FOR FABRICATING THE SAME

(75) Inventors: Tatsuya Kabe, Toyama (JP); Susumu Matsumoto, Toyama (JP)

(73) Assignee: Panasonic Corporation, Osaka (JP)

( * ) Notice: Subject to any disclaimer, the term of this patent is extended or adjusted under 35 U.S.C. 154(b) by 49 days.

(21) Appl. No.: 13/271,835

(22) Filed: Oct. 12, 2011

(65) Prior Publication Data

US 2012/0025381 A1   Feb. 2, 2012

Related U.S. Application Data

(63) Continuation of application No. PCT/JP2010/000286, filed on Jan. 20, 2010.

(30) Foreign Application Priority Data

Jun. 4, 2009   (JP) .................................. 2009-134742

(51) Int. Cl.
    *H01L 23/532*   (2006.01)
(52) U.S. Cl.
    USPC ........... 257/751; 257/752; 257/753; 257/758; 257/E21.584
(58) Field of Classification Search
    USPC .................. 257/751, E21.584, E23.161, 752, 257/753, 758; 438/627, 643
    See application file for complete search history.

(56) References Cited

U.S. PATENT DOCUMENTS

| 7,053,487 | B2 * | 5/2006 | Saito et al. ..................... 257/750 |
| 7,663,239 | B2 * | 2/2010 | Ikeda et al. .................... 257/751 |
| 2003/0001273 | A1 * | 1/2003 | Steiner et al. .................. 257/760 |
| 2003/0089928 | A1 | 5/2003 | Saito et al. |
| 2003/0232137 | A1 | 12/2003 | Vetis et al. |
| 2005/0218519 | A1 | 10/2005 | Koike et al. |
| 2008/0054464 | A1 * | 3/2008 | Ikeda et al. .................... 257/751 |

FOREIGN PATENT DOCUMENTS

| JP | 2003-152077 | 5/2003 |
| JP | 2004-006822 | 1/2004 |
| JP | 2004-356315 | 12/2004 |
| JP | 2005-277390 | 10/2005 |
| JP | 2006-019325 | 1/2006 |

\* cited by examiner

*Primary Examiner* — Thinh T Nguyen
(74) *Attorney, Agent, or Firm* — McDermott Will & Emery LLP

(57) ABSTRACT

An interlayer insulating film containing oxygen and carbon is formed on a semiconductor substrate. A groove is formed in the interlayer insulating film. An auxiliary film containing predetermined first and second metallic elements is formed on a bottom surface and a sidewall of the formed groove. Then, an interconnect body layer containing copper is formed to fill the groove. By performing a thermal treatment, a first barrier film containing a compound of the first metallic element and an oxygen element of the interlayer insulating film, and a second barrier film containing a compound of the second metallic element and carbon element of the interlayer insulating film are formed on the interlayer insulating film on the bottom surface and the sidewall of the groove.

12 Claims, 7 Drawing Sheets

SEMICONDUCTOR DEVICE AND METHOD FOR FABRICATING THE SAME

CROSS-REFERENCE TO RELATED APPLICATION

This is a continuation of PCT International Application PCT/JP2010/000286 filed on Jan. 20, 2010, which claims priority to Japanese Patent Application No. 2009-134742 filed on Jun. 4, 2009. The disclosures of these applications including the specifications, the drawings, and the claims are hereby incorporated by reference in their entirety.

BACKGROUND

The present invention relates to semiconductor devices and method for fabricating the same, specifically a semiconductor device having a damascene interconnect structure and a method for fabricating the same.

In recent years, an interconnect structure including copper (Cu) and a low dielectric constant insulating film in order to increase speed and integration density has been developed in a semiconductor integrated circuit using silicon (Si). In the case of the interconnect structure including Cu, interdiffusion between a Cu layer (interconnect body layer) and a peripheral insulating film is likely to occur during various thermal treatments performed in processes to form an integrated circuit, and the Cu layer easily reacts with oxygen (O) in an oxygen atmosphere to form a Cu oxide film. Thus, before forming the Cu layer, it is necessary to form a barrier film made of tantalum (Ta), tantalum nitride (TaN), and the like. In particular, when the Cu layer is buried in an interlayer insulating film as in the case of the damascene interconnect structure, the diffusion of Cu atoms into the interlayer insulating film becomes significant, and thus it is essential to form the diffusion barrier film.

In order to ensure the reliability of the interconnect structure including Cu, existing processing technologies require a barrier film having a thickness of 10 nm or larger. Moreover, in order to reduce interconnect resistance along with a future reduction in interconnect width, it is required to reduce the thickness of the barrier film by generations. However, in a conventional method for forming a barrier film, it is difficult to uniformly and homogeneously form the barrier film in an interconnect groove and a sidewall of a via hole (interconnect connecting hole). Therefore, problems with the reliability of the interconnect structure arise, where an example of the problems is that barrier properties of the barrier film, interface adherence between the barrier film and the Cu layer, and resistance against electromigration due to interfacial diffusion cannot be ensured.

As a method capable of solving these problems and reducing the thickness of the barrier film, it has been proposed that metal added to the Cu layer is diffused through a thermal treatment into the interface between the Cu layer and the insulating film to allow the reaction of the diffused metal with the insulating film, thereby forming an stable compound, which is used as the barrier film.

A method in which a barrier film is formed in a self-aligned manner by using an element such as manganese (Mn) which rapidly diffuses in Cu and reacts with oxygen in an insulating film has been described, for example, in Japanese Patent Publication No. 2005-277390.

SUMMARY

In semiconductor development in recent years, the proportion of carbon (C) contained in the element forming the interlayer insulating film has been increasing due to the demand for reducing the electric constant of the interlayer insulating film. There may be a case in which 20 atomic percent (at. %) or more of carbon is contained. Some of such insulating films may have a local region in which the concentration of oxygen (O) is low. When a metallic element is used as described above to form the barrier film in a self-aligned manner, for example, the formed barrier film may have a small thickness, so that a uniform film may not be formed. Moreover, a highly volatile substance containing carbon and hydrogen (H) as main components is added to a film referred to as an ultra-low dielectric constant film (see, for example, U.S. Pat. No. 6,846,515). When such a substance exists at the interface between the insulating film and the Cu layer, it is very difficult to form the barrier film in a self-aligned manner.

In view of the problems discussed above, an example technique of the present invention may be capable of improving the reliability of the interconnect structure in which a barrier film is formed in a self-aligned manner even when an insulating film having a high carbon content is used.

An example barrier film in a semiconductor device of the present invention contains at least two types of compounds of metallic elements and constituent elements of an interlayer insulating film as main components.

Specifically, an example semiconductor device of the present invention includes: an interlayer insulating film which is formed on a semiconductor substrate and includes a groove; a barrier film formed on a bottom surface and a sidewall of the grove; and an interconnect body layer which is formed on the barrier film to fill the groove and contains copper as a main component, wherein the barrier film contains at least a first metallic element and a second metallic element, the interlayer insulating film contains at least a first constituent element and a second constituent element, and the barrier film has a compound portion made of the first metallic element and the first constituent element and a compound portion made of the second metallic element and the second constituent element at an interface between the barrier film and the interlayer insulating film.

With the semiconductor device of the present invention, a highly reliable barrier film can be obtained in a self-aligned manner even when an insulating film has a high carbon content, so that it is possible to improve the reliability of the interconnect structure.

The example semiconductor device of the present invention preferably further includes: a conductive layer which is formed under the interconnect body layer, and includes a connection portion connected to part of the interconnect body layer, wherein the barrier film is not provided at the connection portion at which the conductive layer is connected to the interconnect body layer.

In the example semiconductor device of the present invention, the barrier film is also preferably formed on an upper surface of the interconnect body layer.

In the example semiconductor device of the present invention, the first metallic element is preferably a metallic element which easily forms a compound with silicon, oxygen, and carbon, and the second metallic element is preferably a metallic element which easily forms a compound with silicon, oxygen, and carbon, and has a slower diffusion rate in copper than the first metallic element.

In this case, oxide of the first metallic element and carbide of the second metallic element preferably have diffusion barrier properties against copper.

Moreover, the second metallic element is preferably an element which does not form an intermetallic compound with the first metallic element.

Furthermore, the first metallic element is preferably at least one element selected from the group consisting of manganese, niobium, zirconium, chromium, vanadium, yttrium, technetium, and rhenium, and the second metallic element is preferably at least one element of tantalum or titanium.

In the example semiconductor device according to the present invention, the interlayer insulating film preferably contains silicon and oxygen as main components, is preferably a low dielectric constant film containing 20 at. % or more of carbon, and preferably includes a local region in which a concentration of the carbon is high.

In the example semiconductor device according to the present invention, the interlayer insulating film is preferably a low dielectric constant film which contains silicon and oxygen as main components, preferably includes a hole, and preferably contains a volatile compound containing carbon as a main component to form the hole.

In the example semiconductor device according to the present invention, the first constituent element is preferably oxygen, and the second constituent element is preferably carbon.

In the example semiconductor device according to the present invention, at the interface between the barrier film and the interlayer insulating film, an area in which the compound portion composed of the second metallic element and the second constituent element covers the interlayer insulating film is preferably smaller than an area in which the compound portion composed of the first metallic element and the first constituent element covers the interlayer insulating film.

An example method for fabricating a semiconductor device according to the present invention includes: forming an interlayer insulating film containing oxygen and carbon on a semiconductor substrate, and forming a groove in the interlayer insulating film; forming an auxiliary film containing a predetermined first metallic element and a predetermined second metallic element on a bottom surface and a sidewall of the groove; after the forming the auxiliary film, forming an interconnect body layer containing copper as a main component to fill the groove; and after the forming the auxiliary film, performing a thermal treatment on the auxiliary film; wherein in the thermal treatment, the first metallic element of the auxiliary film is diffused into the interlayer insulating film facing the auxiliary film to form a first barrier film containing a compound of the first metallic element and an oxygen element of the interlayer insulating film as a main component on the interlayer insulating film on the bottom surface and the sidewall of the groove, and then the second metallic element of the auxiliary film is diffused into the interlayer insulating film facing the auxiliary film to form a second barrier film containing a compound of the second metallic element and a carbon element of the interlayer insulating film as a main component.

With the method for fabricating the semiconductor device according to the present invention, a highly reliable barrier film can be formed in a self-aligned manner even when an insulating film having a high carbon content is formed, so that it is possible to improve the reliability of the interconnect structure.

The example method of the present invention preferably further includes: after the forming the interconnect body layer, forming an upper insulating film on the interconnect body layer, wherein after the forming the upper insulating film, the thermal treatment on the auxiliary film is performed to also diffuse the first metallic element and the second metallic element of the auxiliary film into an upper portion of the interconnect body layer to form a film made of a reaction product containing a compound of the first metallic element, the second metallic element, and a constituent element of the upper insulating film as a main component in the upper portion of the interconnect body layer.

In the example method of the present invention, after the forming the interconnect body layer, the thermal treatment on the auxiliary film is preferably performed in an oxygen-containing atmosphere to also diffuse the first metallic element and the second metallic element of the auxiliary film into an upper portion of the interconnect body layer to form a film made of a reaction product containing oxide of the first metallic element and oxide of the second metallic element as main components in the upper portion of the interconnect body layer.

In the example method of the present invention, the first metallic element and the second metallic element are preferably contained only in the auxiliary film.

In the example method of the present invention, the auxiliary film is preferably made of a single-layer film which contains the first metallic element and the second metallic element, or a layered film composed of a film which contains the first metallic element and does not contain the second metallic element and a film which does not contain the first metallic element and contains the second metallic element.

According to the semiconductor device of the present invention and the method for fabricating the same, a highly reliable barrier film can be formed in a self-aligned manner, so that it is possible to improve the reliability of the interconnect structure.

DETAILED DESCRIPTION

First Example Embodiment

A method for fabricating a semiconductor device according to a first example embodiment of the present invention will be described with reference to FIGS. 1A-1D.

Figure 1A:
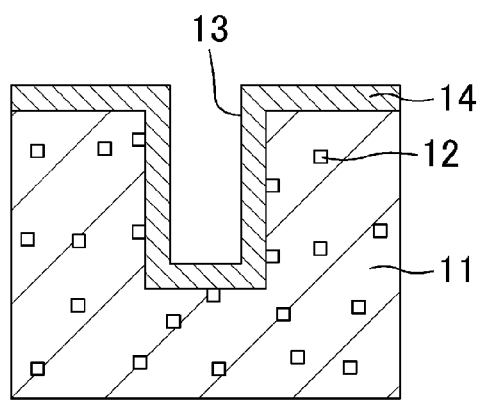
FIGS. 1A-1D are cross-sectional views illustrating processes of a method for fabricating a semiconductor device according to a first example embodiment of the present invention in a sequential order.

First, as illustrated in FIG. 1A, an interconnect groove 13 is formed in an interlayer insulating film 11. The interlayer insulating film 11 includes high carbon concentration regions 12, and is made of carbon-containing silicon oxide (SiOC). The high carbon concentration regions 12 are local regions in which the concentration of carbon (C) is high. Next, an alloy auxiliary film 14 containing copper (Cu), manganese (Mn), and tantalum (Ta) is formed on a bottom surface and a sidewall of the interconnect groove 13 and on the interlayer insulating film 11 in the periphery of the interconnect groove 13. The alloy auxiliary film 14 is formed by, for example, sputtering to have a thickness of about 5 nm-100 nm. The alloy auxiliary film 14 has a Mn content of about 0.05-20 at. %, and a Ta content of about 0.05-5 at. %. The alloy auxiliary film 14 serves as a seed layer of the time when electrolytic plating is performed on a later described Cu layer 19. Alternatively, the alloy auxiliary film 14 may be a layered film including a film made of an alloy of Cu and Mn and a film made of an alloy of Cu and Ta.

Figure 1B:
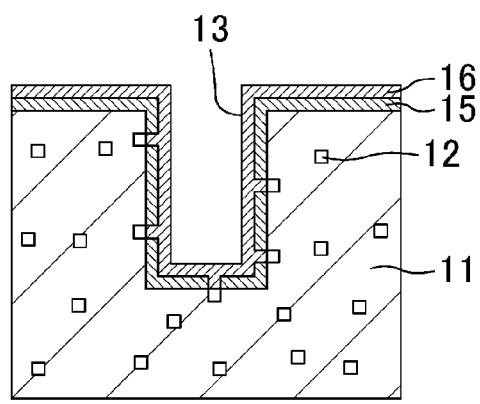

Next, as illustrated in FIG. 1B, a thermal treatment at about 100° C.-400° C. for about 5-30 minutes, for example, a thermal treatment at 300° C. for 5 minutes, is performed. In this way, the Mn and the Ta in the alloy auxiliary film 14 receive force in a direction in which they are released from the Cu in the alloy auxiliary film 14. The diffusion rate of Mn in Cu is higher than that of Ta. Thus, the Mn in the alloy auxiliary film 14 first diffuses into the interlayer insulating film 11 facing the alloy auxiliary film 14. The Mn thus supplied from the alloy auxiliary film 14 reacts with oxygen (O) which is one of constituent elements of the interlayer insulating film 11. As a result, a first barrier film 15 which has a thickness of about 5 nm or smaller, for example, a thickness of 2 nm, and contains manganese oxide (MnO) which is a very stable compound as a main component is formed in a self-aligned manner on the bottom surface and the sidewall of the interconnect groove 13 and on the interlayer insulating film 11 in the periphery of the interconnect groove 13. On the other hand, the formation of the first barrier film 15 is inhibited in the vicinity of the high carbon concentration regions 12. Moreover, along with the formation of the first barrier film 15, part of the alloy auxiliary film 14 opposite to the interlayer insulating film 11 becomes an alloy film 16 made of Cu and Ta.

Figure 1C:
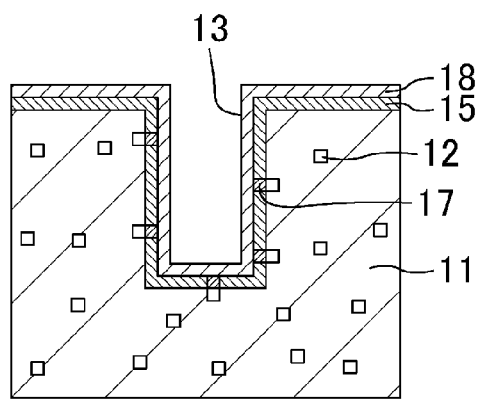

Subsequently, as illustrated in FIG. 1C, the Ta in the alloy film 16 diffuses into the interlayer insulating film 11 facing the alloy film 16. In regions in which the formation of the first barrier film 15 is inhibited, the Ta reacts with carbon which is one of the constituent elements of the interlayer insulating film 11. As a result, second barrier films 17 which have a thickness of about 5 nm or smaller, for example, a thickness of 2 nm, and contain tantalum carbide (TaC) which is a very stable compound as a main component are formed in a self-aligned manner in the regions in which the formation of the first barrier film 15 is inhibited. Note that part of the alloy film 16 opposite to the interlayer insulating film 11 becomes a Cu film 18 having a low Mn content and a low Ta content.

Figure 1D:
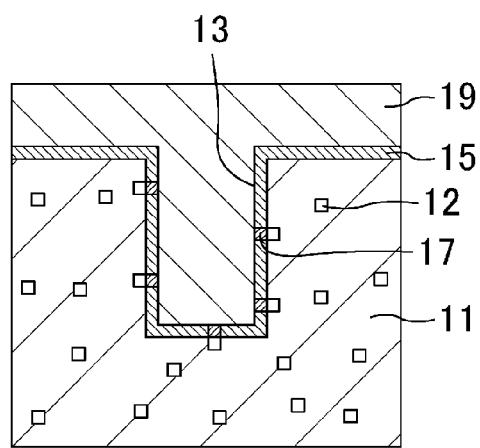

Next, as illustrated in FIG. 1D, the Cu layer 19 which will be an interconnect body layer is formed by electrolytic plating so that the interconnect groove 13 is filled with the Cu layer 19. Although subsequent processes are not illustrated in the figure, the Cu layer 19 outside the interconnect groove 13 is polished and removed by a planarization process such as chemical mechanical polishing (CMP) to form a low-resistance interconnect body layer which is the Cu layer 19 in the interconnect groove 13.

With the method for fabricating the semiconductor device according to the first example embodiment, a highly reliable barrier film can be formed in a self-aligned manner even when an insulating film having a high carbon content is formed, so that it is possible to improve the reliability of the interconnect structure.

Variation of First Example Embodiment

A method for fabricating a semiconductor device according to a variation of the first example embodiment of the present invention will be described with reference to FIGS. 2A-2C. Processes for forming an interlayer insulating film 11, high carbon concentration regions 12, an interconnect groove 13, and an alloy auxiliary film 14 are the same as those in the first example embodiment illustrated in FIG. 1A, and thus description thereof is omitted.

Figure 2A:
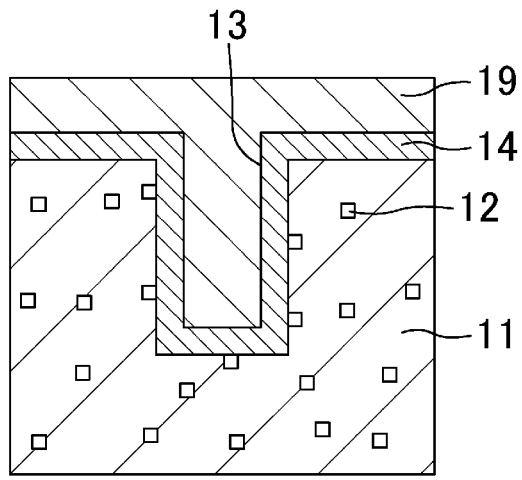
FIGS. 2A-2C are cross-sectional views illustrating processes of a method for fabricating a semiconductor device according to a variation of the first example embodiment of the present invention in a sequential order.

First, as illustrated in FIG. 2A, a Cu layer 19 which will be an interconnect body layer is formed by electrolytic plating so that the interconnect groove 13 is filled with the Cu layer 19.

Figure 2B:
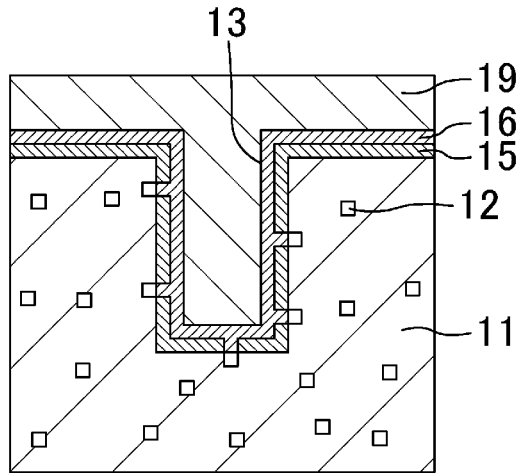

Next, as illustrated in FIG. 2B, a thermal treatment at about 100° C.-400° C. for about 5-30 minutes, for example, a thermal treatment at 300° C. for 5 minutes is performed. In this way, the Mn and the Ta in the alloy auxiliary film 14 receive force in a direction in which they are released from the Cu in the alloy auxiliary film 14. The diffusion rate of Mn in Cu is higher than that of Ta. Thus the Mn in the alloy auxiliary film 14 first diffuses into the interlayer insulating film 11 facing the alloy auxiliary film 14. The Mn thus supplied from the alloy auxiliary film 14 reacts with oxygen which is one of constituent elements of the interlayer insulating film 11. As a result, a first barrier film 15 which has a thickness of about 5 nm or smaller, for example, a thickness of 2 nm, and contains manganese oxide (MnO) which is a very stable compound as a main component is formed in a self-aligned manner on a bottom surface and a sidewall of the interconnect groove 13 and on the interlayer insulating film 11 in the periphery of the interconnect groove 13. On the other hand, the formation of the first barrier film 15 is inhibited in the vicinity of the high carbon concentration regions 12. Moreover, along with the formation of the first barrier film 15, part of the alloy auxiliary film 14 opposite to the interlayer insulating film 11 becomes an alloy film 16 made of Cu and Ta.

Figure 2C:
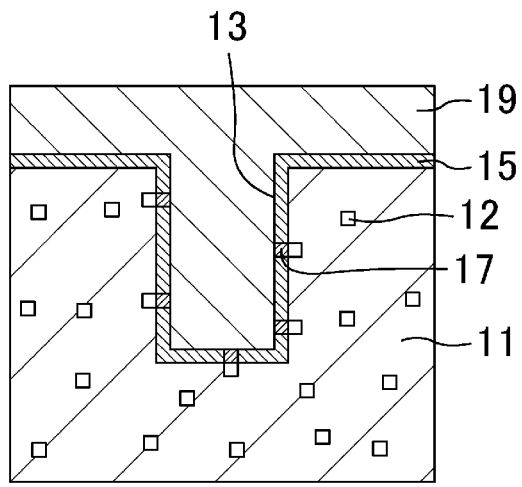

Subsequently, as illustrated in FIG. 2C, the Ta in the alloy film 16 diffuses into the interlayer insulating film 11 facing the alloy film 16. In regions in which the formation of the first barrier film 15 is inhibited, the Ta reacts with carbon which is one of the constituent elements of the interlayer insulating film 11. As a result, second barrier films 17 which have a thickness of about 5 nm or smaller, for example, a thickness of 2 nm and contain tantalum carbide (TaC) which is a very stable compound as a main component are formed in a self-aligned manner in the regions in which the formation of the first barrier film 15 is inhibited. Note that the Mn content and the Ta content in part of the alloy film 16 opposite to the interlayer insulating film 11 decrease, and the part of the alloy film 16 opposite to the interlayer insulating film 11 is substantially integrated into the interconnect body layer, which is the Cu layer 19.

Although subsequent processes are not illustrated in the figure, the Cu layer 19 outside the interconnect groove 13 is polished and removed by, for example, CMP to form a low-resistance interconnect body layer which is the Cu layer 19 in the interconnect groove 13.

With the method for fabricating the semiconductor device according to the variation of the first example embodiment, a highly reliable barrier film can be formed in a self-aligned manner even when an insulating film having a high carbon content is formed, so that it is possible to improve the reliability of the interconnect structure.

Second Example Embodiment

A method for fabricating a semiconductor device according to a second example embodiment of the present invention will be described with reference to FIGS. 3A-3C. Processes for forming an interlayer insulating film 11, high carbon concentration regions 12, an interconnect groove 13, and an alloy auxiliary film 14 are the same as those in the first example embodiment illustrated in FIG. 1A, and thus description thereof is omitted.

Figure 3A:
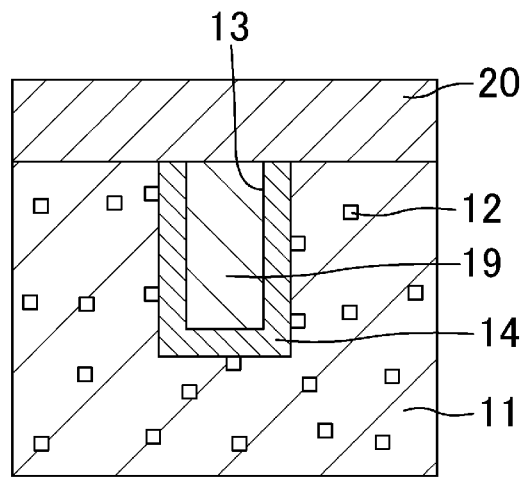
FIGS. 3A-3C are cross-sectional views illustrating processes of a method for fabricating a semiconductor device of a second example embodiment of the present invention in a sequential order.

As illustrated in FIG. 3A, a Cu layer 19 which will be an interconnect body layer is formed by electrolytic plating so that the interconnect groove 13 is filled with the Cu layer 19. Subsequently, the Cu layer 19 and the alloy auxiliary film 14 outside the interlayer insulating film 11 are polished and removed by, for example, CMP to form a low-resistance interconnect body layer which is the Cu layer 19 in the interconnect groove 13. Next, an upper insulating film 20 made of silicon carbide (SiC), nitrogen-containing silicon carbide (SiCN), or silicon nitride (SiN) which is a carbon-containing compound is formed to cover the interlayer insulating film 11, the alloy auxiliary film 14, and the Cu layer 19.

Figure 3B:
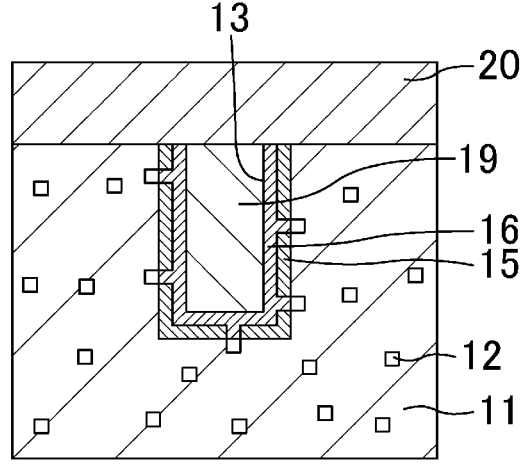

Next, as illustrated in FIG. 3B, a thermal treatment at about 100° C.-400° C. for about 5-30 minutes, for example, a thermal treatment at 300° C. for 5 minutes is performed. In this way, the Mn and the Ta in the alloy auxiliary film 14 receive force in a direction in which they are released from the Cu in the alloy auxiliary film 14. The diffusion rate of Mn in Cu is higher than that of Ta. Thus, the Mn in the alloy auxiliary film 14 first diffuses into the interlayer insulating film 11 facing the alloy auxiliary film 14. The Mn thus supplied from the alloy auxiliary film 14 reacts with oxygen which is one of constituent elements of the interlayer insulating film 11. As a result, a first barrier film 15 which has a thickness of about 5 nm or smaller, for example, a thickness of 2 nm and contains manganese oxide (MnO) which is a very stable compound as a main component is formed in a self-aligned manner on a bottom surface and a sidewall of the interconnect groove 13. On the other hand, the formation of the first barrier film 15 is inhibited in the vicinity of the high carbon concentration regions 12. Moreover, along with the formation of the first barrier film 15, part of the alloy auxiliary film 14 opposite to the interlayer insulating film 11 becomes an alloy film 16 made of Cu and Ta.

Figure 3C:
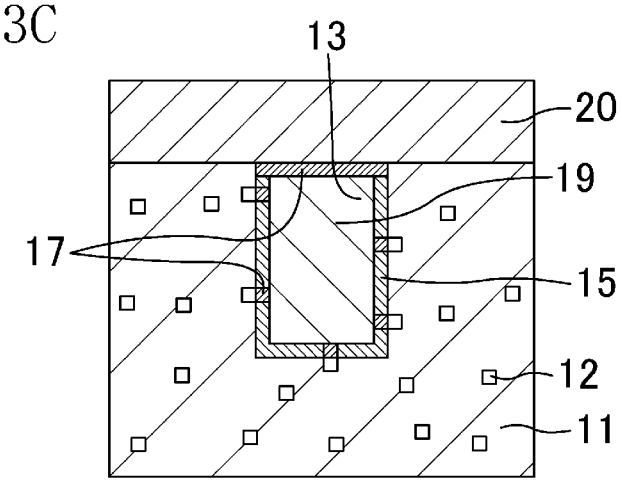

Subsequently, as illustrated in FIG. 3C, the Ta in the alloy film 16 diffuses into the interlayer insulating film 11 facing the alloy film 16, and also diffuses to an upper surface of the Cu layer 19. In regions in which the formation of the first barrier film 15 is inhibited, the Ta reacts with carbon which is one of the constituent elements of the interlayer insulating film 11. Moreover, the Ta also reacts with carbon which is one of constituent elements of the upper insulating film 20. As a result, second barrier films 17 which have a thickness of about 5 nm or smaller, for example, a thickness of 2 nm, and contain tantalum carbide (TaC) which is a very stable compound as a main component are formed in a self-aligned manner in the regions in which the formation of the first barrier film 15 is inhibited, and on the upper surface of Cu layer 19. Note that the Mn content and the Ta content in part of the alloy film 16 opposite to the interlayer insulating film 11 decrease, and the part of the alloy film 16 opposite to the interlayer insulating film 11 is substantially integrated into the interconnect body layer, which is the Cu layer 19.

With the method for fabricating the semiconductor device according to the second example embodiment, a highly reliable barrier film can be formed in a self-aligned manner even when an insulating film having a high carbon content is formed, so that it is possible to improve the reliability of the interconnect structure.

Third Example Embodiment

A semiconductor device according to a third example embodiment of the present invention will be described with reference to FIG. 4.

Figure 4:
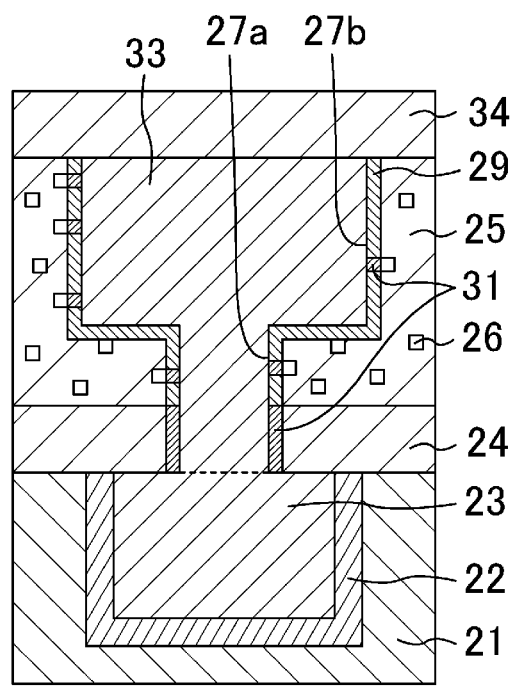
FIG. 4 is a cross-sectional view illustrating an example structure of a semiconductor device of a third example embodiment of the present invention.

As illustrated in FIG. 4, a lower barrier film 22 is formed on a bottom surface and a sidewall of a groove in a lower interlayer insulating film 21 made of, for example, SiOC. On the lower barrier film 22, a lower Cu layer (lower interconnect body layer) 23 serving as a conductive layer is formed to fill the groove in the lower interlayer insulating film 21. Moreover, a lower diffusion barrier film (upper insulating film) 24 is formed on the lower interlayer insulating film 21, the lower barrier film 22, and the lower Cu layer 23. An upper interlayer insulating film 25 is formed on the lower diffusion barrier film 24. The upper interlayer insulating film 25 has a groove, and includes high carbon concentration regions 26 which are local regions in which the concentration of carbon is high. In a bottom surface of the groove in the upper interlayer insulating film 25, an interconnect connecting hole 27a is formed. The interconnect connecting hole 27a penetrates through the lower diffusion barrier film 24, and reaches the lower Cu layer 23. A first upper barrier film 29 and second upper barrier films 31 are formed on the bottom surface and a sidewall of the groove of the upper interlayer insulating film 25 and on a sidewall of the interconnect connecting hole 27a. On the first upper barrier film 29 and the second upper barrier films 31, an upper Cu layer (upper interconnect body layer) 33 is formed to fill the interconnect connecting hole 27a and the groove in the upper interlayer insulating film 25. The second upper barrier films 31 in regions adjacent to the lower diffusion barrier film 24 and in regions in the vicinity of the high carbon concentration regions 26 are made of TaC. The first upper barrier film 29 in a region in contact with the upper interlayer insulating film 25 is made of MnO. Moreover, an upper diffusion barrier film (upper insulating film) 34 is formed to cover the upper interlayer insulating film 25, the first upper barrier film 29, and the upper Cu layer 33.

With the semiconductor device according to the third example embodiment, a highly reliable barrier film can be obtained in a self-aligned manner even when an insulating film having a high carbon content is provided, so that it is possible to improve the reliability of the interconnect structure.

Next, a method for fabricating the semiconductor device according to the third example embodiment of the present invention will be described with reference to FIGS. 5A-5D, and FIGS. 6A-6C. The method for fabricating semiconductor device according to the present embodiment is obtained by applying the first example embodiment to a method for fabricating a dual damascene interconnect structure.

Figure 5A:
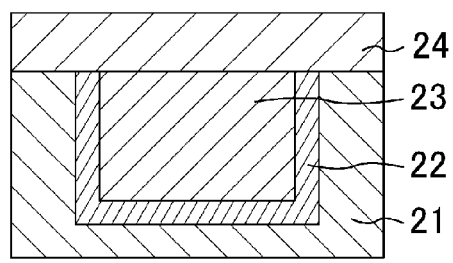
FIGS. 5A-5D are cross-sectional views illustrating processes of a method for fabricating the semiconductor device of the third example embodiment of the present invention in a sequential order.

First, as illustrated in FIG. 5A, an interconnect groove is formed in the lower interlayer insulating film 21 made of, for example, a SiOC film. The lower barrier film 22 is formed on a bottom surface and a sidewall of the interconnect groove. The lower Cu layer (lower interconnect body layer) 23 is formed to cover the lower barrier film 22 and to fill the interconnect groove. Note that the lower barrier film 22 and the lower Cu layer 23 can be formed by the methods according to the first example embodiment, the variation of the first example embodiment, or the second example embodiment, and description thereof is omitted. Subsequently, the lower diffusion barrier film 24 made of SiN, SiCN, or the like is formed to cover the lower interlayer insulating film 21, the lower barrier film 22, and the lower Cu layer 23.

Figure 5B:
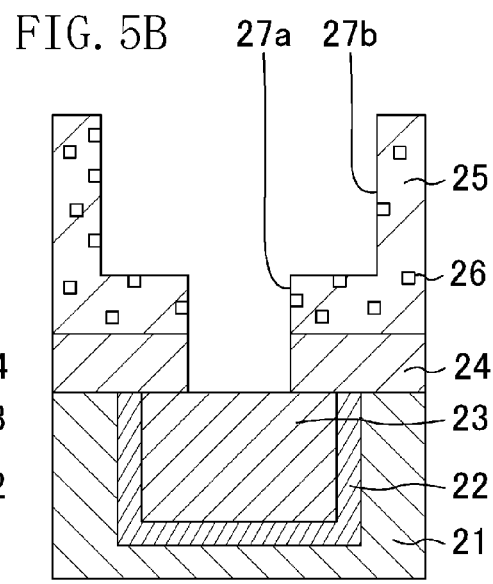

Next, as illustrated in FIG. 5B, the upper interlayer insulating film 25 made of SiOC is formed on the lower diffusion barrier film 24. The upper interlayer insulating film 25 includes the high carbon concentration regions 26 which are local regions in which the concentration of carbon is high. The upper interlayer insulating film 25 has a thickness of about 100 nm-600 nm. Subsequently, in the upper interlayer insulating film 25, an interconnect groove 27b is formed, and the interconnect connecting hole 27a penetrating through the lower diffusion barrier film 24 is further formed. In the interconnect connecting hole 27a, the lower Cu layer 23 is exposed.

Figure 5C:
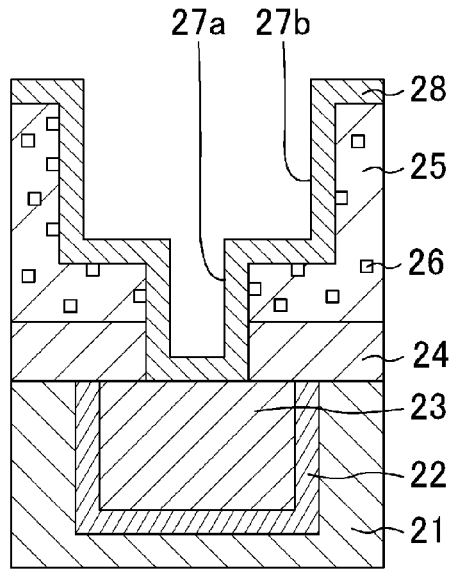

Next, as illustrated in FIG. 5C, an alloy auxiliary film 28 having a thickness of about 5 nm-100 nm and made of Cu, Mn, and Ta is formed by, for example, chemical vapor deposition (CVD) on a bottom surface and the sidewall of the interconnect connecting hole 27a, on a bottom surface and a sidewall of the interconnect groove 27b, and on the upper interlayer insulating film 25 in the periphery of the interconnect groove 27b. Here, the method for forming the alloy auxiliary film 28 is not limited to CVD, but the alloy auxiliary film 28 may be formed by physical vapor deposition (PVD), non-electrolytic plating, or the like. In the case of CVD, source gas containing Mn and Ta is used, and in the case of non-electrolytic plating, a plating solution containing Mn and Ta is used. The alloy auxiliary film 28 made of Cu, Mn, and Ta preferably has a Mn content of about 0.05-20 at. % and a Ta content of about 0.05-5 at. %. A thermal treatment to diffuse Mn and Ta up to the upper interlayer insulating film 25 is preferably performed at a temperature of about 50° C.-400° C. for about 60 minutes or shorter.

Figure 5D:
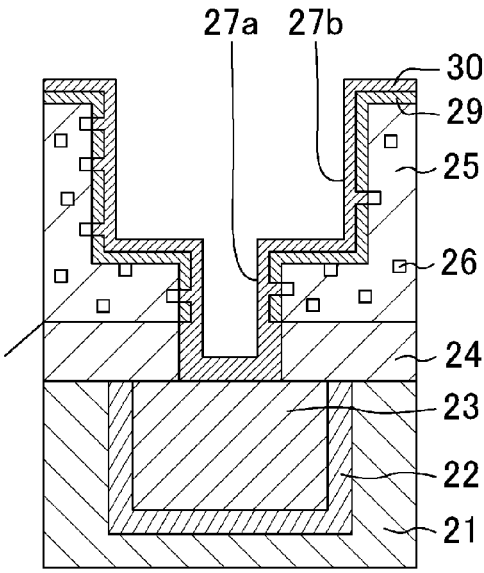

Next, as illustrated in FIG. 5D, a thermal treatment at about 100° C.-400° C. for about 5-30 minutes, for example, a thermal treatment at 300° C. for 5 minutes is performed. In this way, the Mn and the Ta in the alloy auxiliary film 28 receive force in a direction in which they are released from the Cu in the alloy auxiliary film 28. The diffusion rate of Mn in Cu is higher than that of Ta. Thus, the Mn in the alloy auxiliary film 28 first diffuses into the upper interlayer insulating film 25 facing the alloy auxiliary film 28. The Mn thus supplied from the alloy auxiliary film 28 reacts with oxygen which is one of constituent elements of the upper interlayer insulating film 25. As a result, the first upper barrier film 29 which has a thickness of about 5 nm or smaller, for example, a thickness of 2 nm and contains manganese oxide (MnO) which is a very stable compound as a main component is formed in a self-aligned manner on part of the sidewall of the interconnect connecting hole 27a which is in contact with the upper interlayer insulating film 25, on the bottom surface and the sidewall of the interconnect groove 27b, and on the upper interlayer insulating film 25 in the periphery of the interconnect groove 27b. On the other hand, the formation of the first upper barrier film 29 is inhibited in the vicinity of the high carbon concentration regions 26. Moreover, along with the formation of the first upper barrier film 29, part of the alloy auxiliary film 28 opposite to the upper interlayer insulating film 25 becomes an alloy film 30 made of Cu and Ta.

Figure 6A:
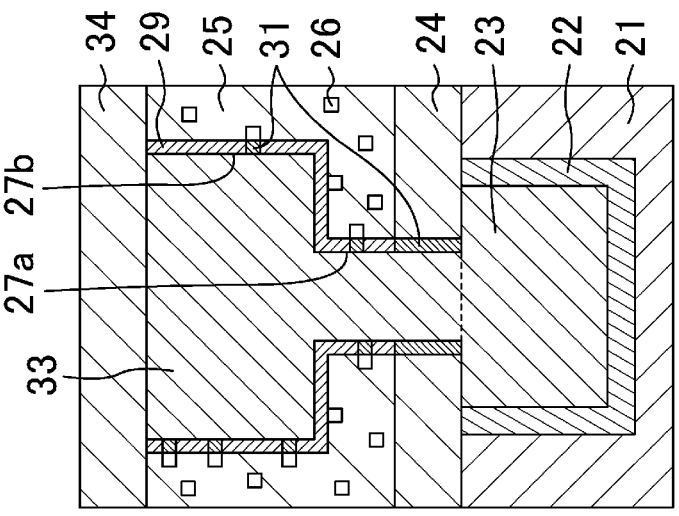
FIGS. 6A-6C are cross-sectional views illustrating processes of a method for fabricating the semiconductor device of the third example embodiment of the present invention in a sequential order.

Subsequently, as illustrated in FIG. 6A, the Ta in the alloy film 30 diffuses into the upper interlayer insulating film 25 and the lower diffusion barrier film 24 which face the alloy film 30. In this way, in a region of the sidewall of the interconnect connecting hole 27a which is in contact with the lower diffusion barrier film 24, and in regions in which the formation of the first upper barrier film 29 is inhibited, the diffused Ta reacts with carbon which is one of constituent elements of the lower diffusion barrier film 24 and the upper interlayer insulating film 25. As a result, the second upper barrier films 31 which have a thickness of about 5 nm or smaller, for example, a thickness of 2 nm and contain tantalum carbide (TaC) which is a very stable compound as a main component are formed in a self-aligned manner in the region of the sidewall of the interconnect connecting hole 27a which is in contact with the lower diffusion barrier film 24 and in the regions in which the formation of the first upper barrier film 29 is inhibited. Note that part of the alloy film 30 opposite to the upper interlayer insulating film 25 and the lower diffusion barrier film 24 becomes a Cu film 32 having a low Mn content and a low Ta content. Here, on the bottom surface of the interconnect connecting hole 27a, the lower diffusion barrier film 24 and the upper interlayer insulating film 25 are not formed, and thus the first upper barrier film 29 and the second upper barrier films 31 are not formed, but only the Cu film 32 is formed. Thus, the upper Cu layer (upper interconnect body layer) 33 which is formed later is substantially directly connected to the lower Cu layer (lower interconnect body layer) 23 without the first upper barrier film 29 and the second upper barrier films 31 provided between the upper Cu layer 33 and the lower Cu layer 23.

Figure 6B:
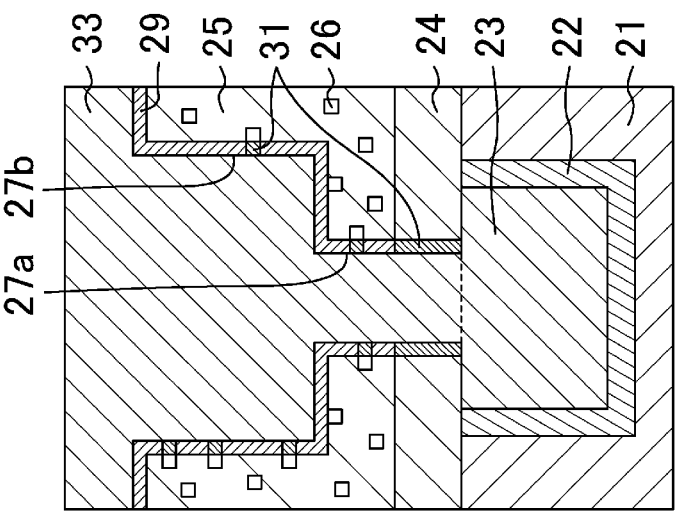

Next, as illustrated in FIG. 6B, the upper Cu layer 33 is formed by electrolytic plating to have a thickness of about 0.8 µm-1 µm so that the interconnect connecting hole 27a and the interconnect groove 27b are filled with the upper Cu layer 33.

Figure 6C:
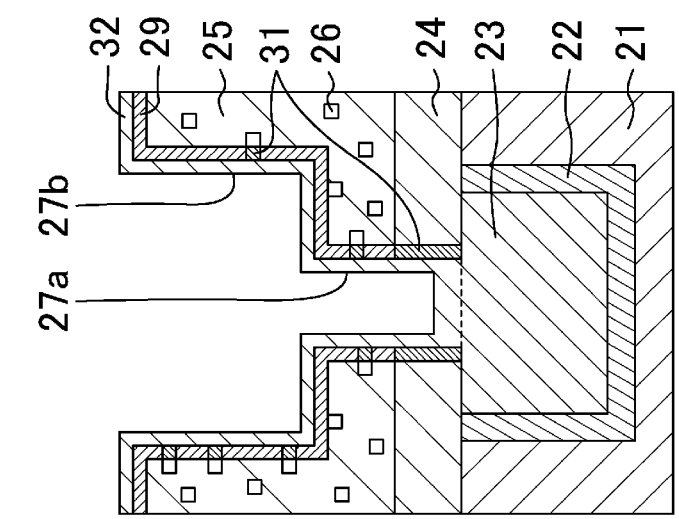

Next, as illustrated in FIG. 6C, the upper Cu layer 33 outside the interconnect groove 27b is removed by CMP, thereby planarizing its surface. Subsequently, the upper diffusion barrier film 34 made of SiC, SiCN, SiN, or the like is formed to cover the upper interlayer insulating film 25 and the upper Cu layer 33.

With the method for fabricating the semiconductor device according to the third example embodiment, the first upper barrier film 29 containing MnO as a main component and a second upper barrier films 31 containing TaC as a main component are formed in a self-aligned manner at an interface between the upper Cu layer 33 serving as an upper interconnect body layer and the upper interlayer insulating film 25 made of SiOC. Moreover, since the upper Cu layer 33 serving as the upper interconnect body layer and the lower Cu layer 23 serving as the lower interconnect body layer are substantially directly in contact with each other without the first upper barrier film 29 and the second upper barrier films 31 being provided therebetween, the contact resistance between the upper interconnect body layer and the lower interconnect body layer can be reduced. Therefore, it is possible to form a Cu interconnect by a self-formation process of the barrier film without increasing the electrical resistance of the interconnect, so that the reliability of the interconnect structure can be improved, and the resistance can be reduced.

Note that in the present embodiment, the first example embodiment has been used, but similar advantages can be obtained even when the variation of the first example embodiment or the second example embodiment is used.

Variation of Third Example Embodiment

A method for fabricating a semiconductor device according to a variation of the third example embodiment of the present invention will be described with reference to FIG. 7.

The present variation is obtained by applying the first example embodiment to a single damascene interconnect structure. Basic processes for fabricating this device are substantially the same as those in the third example embodiment. The difference from the third example embodiment will be described below.

First, in the same manner as in the third example embodiment, the structure illustrated in FIG. 5A is formed.

Figure 7:
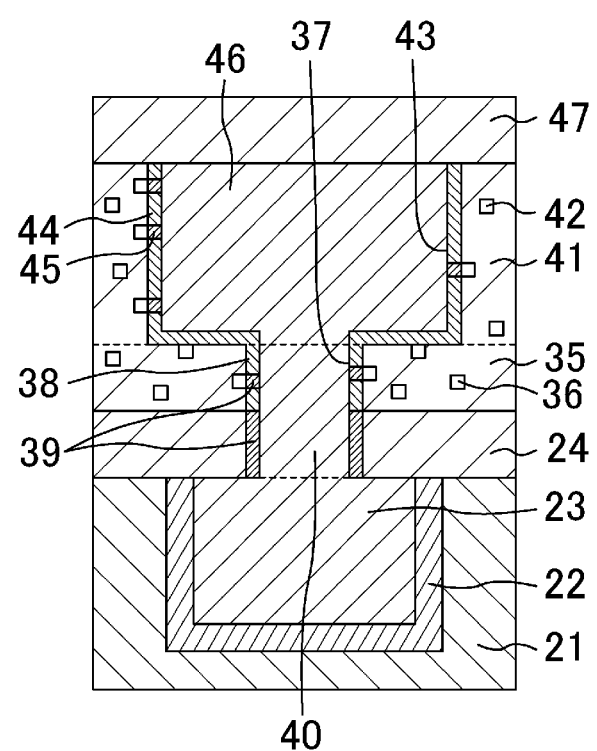
FIG. 7 is a cross-sectional view illustrating a method for fabricating a semiconductor device according to a variation of the third example embodiment of the present invention.

Next, as illustrated in FIG. 7, a middle interlayer insulating film 35 which is made of SiOC and includes high carbon concentration regions 36 is formed on the lower diffusion barrier film 24. An interconnect connecting hole 37 connected to the lower Cu layer 23 is formed in the middle interlayer insulating film 35. Next, on a sidewall of the interconnect connecting hole 37, an alloy film having a thickness of about 5 nm-100 nm and made of Cu, Mn, and Ta is formed by, for example, CVD. Next, a thermal treatment is performed to form a first middle barrier film 38 made of MnO and second middle barrier films 39 made of TaC on the sidewall of the interconnect connecting hole 37. Next, a middle Cu layer 40 is formed to cover the first middle barrier film 38 and the second middle barrier films 39 and to fill the interconnect connecting hole 37, and the middle Cu layer 40 outside the interconnect connecting hole 37 is removed by CMP.

Next, processes similar to the above processes are performed to form an upper interlayer insulating film 41 including high carbon concentration regions 42, an upper interconnect groove 43, a first upper barrier film 44 made of MnO, and second upper barrier films 45 made of TaC, and the upper interconnect groove 43 is filled with an upper Cu layer 46. Here, the first upper barrier film 44 and the second upper barrier films 45 are not formed on the middle Cu layer 40, and the upper Cu layer 46 is connected to the middle Cu layer 40. Next, the upper Cu layer 46 outside the interconnect groove is removed by CMP, and then an upper diffusion barrier film (upper insulating film) 47 is formed to cover the upper interlayer insulating film 41, the first upper barrier film 44, and the upper Cu layer 46.

Also in this configuration, between (i) the middle Cu layer 40 and the upper Cu layer 46 respectively filled in the interconnect connecting hole 37 and the upper interconnect groove 43 and (ii) the middle interlayer insulating film 35 and the upper interlayer insulating film 41, the first middle barrier film 38 and the first upper barrier film 44 which are made of MnO, and the second middle barrier films 39 and the second upper barrier films 45 which are made of TaC are formed. Moreover, the lower Cu layer 23 is directly connected to the middle Cu layer 40 serving as a connecting plug, and the middle Cu layer 40 is directly connected to the upper Cu layer 46 serving as an upper interconnect body layer. Thus, also in the variation of the third example embodiment, the advantages similar to those of the third example embodiment can be obtained.

Although the first example embodiment is used in the present variation, similar advantages can be obtained even when the variation of the first example embodiment, or the second example embodiment is used.

In the first example embodiment, the variation of the first example embodiment, the second example embodiment, the third example embodiment, and the variation of the third example embodiment, the examples in which Cu is used as the interconnect body layer have been described. However, when the interconnect body layer is made of, for example, a Cu alloy which contains Cu as a main component (that is, the content of Cu is 50% or more) and is generally used as interconnects, the advantages similar to those described above can be obtained.

When the barrier film is formed, a metallic element (first metallic element) which has a high diffusion rate in Cu and reacts with oxygen is not limited to Mn, but may include at least one element selected from the group consisting of Mn, niobium (Nb), zirconium (Zr), chromium (Cr), vanadium (V), yttrium (Y), technetium (Tc), and rhenium (Re).

Moreover, when the barrier film is formed, a metallic element (second metallic element) which has a low diffusion rate in Cu and reacts with carbon is not limited to Ta, but may include at least one of Ta or titanium (Ti).

Adding the metallic elements listed above as the second metallic element provides the following advantages compared to the conventional structure including only the first metallic element.

The first metallic element rapidly diffuses in Cu and easily forms oxide, and the oxide serves as a stable barrier film. However, when the proportion of carbon to constituent elements of the interlayer insulating film is large (that is, 20 at. % or more of carbon is included), there are local regions in which oxygen does not exist or local regions in which very little oxygen exists. In such regions, the barrier film containing oxide of the first metallic element as a main component is not formed, so that it becomes difficult to ensure the reliability of the interconnect. The second metallic element slowly diffuses in Cu, and easily forms carbide. When the second metallic element is added, the formation of oxide from the first metallic element is not inhibited, and in addition, carbide from the second metallic element can be formed in the regions in which oxide is not formed. The carbide serves as a barrier film.

Moreover, the material for the interlayer insulating film is not necessarily limited to SiOC, but various insulating films containing oxygen and carbon can be used, where the proportion of carbon is 20 at. % or more. Specifically, as the material for the interlayer insulating film, $SiO_xC_y$, $SiO_xC_yH_z$, or the like can be used. The barrier film may contain, as a main component, a material selected from a group consisting of $\alpha_xO_y$, $\alpha_x\beta_yO_z$, $\alpha_xSi_yO_z$, $\alpha_x\beta_ySi_zO_w$, $\beta_xC_y$, and $\beta_xC_yO_z$. Here, $\alpha$ and $\beta$ represent the predetermined first metallic element, and the predetermined second metallic element, respectively, and w, x, y, and z are positive real numbers. To simplify the description, in the embodiments, Cu is used as the material for the interconnect body layer, SiOC is used as the interlayer insulating film containing 20 at. % or more of carbon, Mn is used as the first metallic element for the barrier film, and MnO and TaC are used for the barrier films, respectively.

The method of filling the interconnect groove, or the like with the Cu film is not limited to electrolytic plating, but CVD, PVD, non-electrolytic plating, a film forming method using critical liquid, or the like may be used. In any of these methods, the advantages similar to those described above can be obtained as long as the interconnect groove and the interconnect connecting hole formed in the interlayer insulating film can be filled with Cu.

Moreover, in a multilayer interconnect structure, the above-described embodiments are applicable to all interconnects from a lowermost layer to an uppermost layer on a semiconductor substrate. That is, in the third example embodiment and the variation of the third example embodiment, application of each embodiment to the interconnect at a second layer (upper interconnect layer) has been described, but the interconnect at a first layer (lower interconnect layer) can be formed in the same manner.

Moreover, in the third example embodiment and the variation of the third example embodiment, the dual damascene and single damascene interconnect structures have been described as examples, but the present invention is applicable to various buried interconnect structures other than the damascene interconnect structures.

Various variations and modifications can be made by a person skilled in the art within the scope of technical idea of the present invention, and are considered within the scope of the present invention.

The semiconductor device and the method for fabricating the same according to the present invention can improve the reliability of the interconnect structure forming a barrier film in a self-aligned manner, and are useful for, in particular, for example, semiconductor devices having a damascene interconnect structure and methods for fabricating the same.

What is claimed is:

1. A semiconductor device comprising:
   an interlayer insulating film which is formed on a semiconductor substrate and includes a groove;
   a barrier film formed on a bottom surface and a side surface of the groove; and
   an interconnect body layer which is formed on the barrier film to fill the groove and contains copper as a main component, wherein:
   the barrier film contains at least a first metallic element and a second metallic element different from the first metallic element,
   the interlayer insulating film contains at least a first constituent element and a second constituent element,
   the barrier film includes a first compound made of the first metallic element and the first constituent element and a second compound made of the second metallic element and the second constituent element, and
   both of the first compound and the second compound are in contact with the interlayer insulating film at the side surface or the bottom surface of the groove.

2. The semiconductor device of claim 1, further comprising:
   a conductive layer which is formed under the interconnect body layer, and includes a connection portion connected to part of the interconnect body layer, wherein
   the barrier film is not provided at the connection portion at which the conductive layer is connected to the interconnect body layer.

3. The semiconductor device of claim 1, wherein
   the barrier film is also formed on an upper surface of the interconnect body layer.

4. The semiconductor device of claim 1, wherein
   the first metallic element is a metallic element which easily forms a compound with silicon, oxygen, and carbon, and the second metallic element is a metallic element which easily forms a compound with silicon, oxygen, and carbon, and has a slower diffusion rate in copper than the first metallic element.

5. The semiconductor device of claim 4, wherein
   oxide of the first metallic element and carbide of the second metallic element have diffusion barrier properties against copper.

6. The semiconductor device of claim 4, wherein
   the second metallic element is an element which does not form an intermetallic compound with the first metallic element.

7. The semiconductor device of claim 4, wherein
   the first metallic element is at least one element selected from the group consisting of manganese, niobium, zirconium, chromium, vanadium, yttrium, technetium, and rhenium, and
   the second metallic element is at least one element of tantalum or titanium.

8. The semiconductor device of claim 1, wherein
   the interlayer insulating film contains silicon and oxygen as main components, is a low dielectric constant film containing 20 atomic percent (at. %) or more of carbon, and includes a local region in which a concentration of the carbon is high.

9. The semiconductor device of claim 1, wherein
   the interlayer insulating film is a low dielectric constant film which contains silicon and oxygen as main components, includes a hole, and contains a volatile compound containing carbon as a main component to form the hole.

10. The semiconductor device of claim 1, wherein
    the first constituent element is oxygen, and
    the second constituent element is carbon.

11. The semiconductor device of claim 1, wherein
    at an interface between the barrier film and the interlayer insulating film, an area in which the second compound is in contact with the interlayer insulating film is smaller than an area in which the first compound is in contact with the interlayer insulating film.

12. The semiconductor device of claim 1, wherein the first compound forms a film shape having an opening and the second compound is disposed in the opening of the film shaped first compound.

* * * * *